(12) United States Patent
Burrows et al.

(10) Patent No.: US 11,680,338 B2
(45) Date of Patent: Jun. 20, 2023

(54) LINEAR LAMP ARRAY FOR IMPROVED THERMAL UNIFORMITY AND PROFILE CONTROL

(71) Applicant: APPLIED MATERIALS, INC., Santa Clara, CA (US)

(72) Inventors: Brian Burrows, San Jose, CA (US); Shu-Kwan Danny Lau, Mountain View, CA (US); Zhiyuan Ye, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 220 days.

(21) Appl. No.: 16/833,352

(22) Filed: Mar. 27, 2020

(65) Prior Publication Data
US 2021/0189593 A1 Jun. 24, 2021

Related U.S. Application Data

(60) Provisional application No. 62/950,855, filed on Dec. 19, 2019.

(51) Int. Cl.
| | |
|---|---|
| *C30B 25/10* | (2006.01) |
| *G02B 7/182* | (2021.01) |
| *C30B 25/08* | (2006.01) |
| *C23C 16/52* | (2006.01) |
| *C30B 25/16* | (2006.01) |
| *C23C 16/44* | (2006.01) |
| *G02B 7/18* | (2021.01) |

(52) U.S. Cl.
CPC .......... *C30B 25/10* (2013.01); *C23C 16/4411* (2013.01); *C23C 16/52* (2013.01); *C30B 25/08* (2013.01); *C30B 25/16* (2013.01); *G02B 7/181* (2013.01); *G02B 7/182* (2013.01)

(58) Field of Classification Search
CPC ......... C30B 25/10; C30B 25/08; C30B 25/16; C30B 25/165; C23C 16/4411; C23C 16/52; G02B 7/181; G02B 7/182; G02B 7/008
See application file for complete search history.

(56) References Cited

U.S. PATENT DOCUMENTS

| | | |
|---|---|---|
| 4,556,786 A | 12/1985 | Frost et al. |
| 4,654,509 A | 3/1987 | Robinson et al. |
| 2007/0062439 A1 | 3/2007 | Wada et al. |

(Continued)

FOREIGN PATENT DOCUMENTS

KR 10-2018-0005465 A 1/2018

OTHER PUBLICATIONS

International Search Report and Written Opinion dated Feb. 17, 2021 for Application No. PCT/US2020/056885.

*Primary Examiner* — Euncha P Cherry
(74) *Attorney, Agent, or Firm* — Patterson + Sheridan, LLP (57) ABSTRACT

Methods and apparatus for an upper reflector assembly for use in a process chamber are provided herein. In some embodiments, an upper reflector assembly for use in a process chamber includes a reflector mounting ring; and upper reflector plate coupled to the reflector mounting ring and having an upper surface and lower surface, wherein the lower surface includes a plurality of linear channels extending substantially parallel to each other across the lower surface, and wherein the upper reflector plate includes air cooling slots extending from the upper surface to the lower surface.

14 Claims, 7 Drawing Sheets

(56) References Cited

U.S. PATENT DOCUMENTS

| | | |
|---|---|---|
| 2009/0214193 A1 | 8/2009 | Suzuki et al. |
| 2010/0054719 A1 | 3/2010 | Mizukawa et al. |
| 2010/0263587 A1* | 10/2010 | Sivaramakrishnan ........................ C30B 25/105 118/725 |
| 2014/0295106 A1 | 10/2014 | Sivaramakrishnan et al. |
| 2016/0027671 A1 | 1/2016 | Ranish et al. |
| 2016/0079062 A1* | 3/2016 | Zheng .................. C23C 16/481 438/498 |
| 2016/0234881 A1 | 8/2016 | Rao et al. |
| 2018/0023214 A1 | 1/2018 | Lau et al. |

\* cited by examiner

LINEAR LAMP ARRAY FOR IMPROVED THERMAL UNIFORMITY AND PROFILE CONTROL

CROSS-REFERENCE TO RELATED APPLICATIONS

This application claims benefit of U.S. provisional patent application Ser. No. 62/950,855, filed Dec. 19, 2019, which is herein incorporated by reference in its entirety.

FIELD

Embodiments of the present disclosure generally relate to substrate processing equipment.

BACKGROUND

Some methods of processing a substrate, for example, epitaxial deposition processes, may be sensitive to temperature in the processing environment of a process chamber. For example, one or more components that may affect temperature of the processing environment may be the chamber walls and/or surfaces where heat can be exchanged with the processing environment. However, lack of thermal control in an epitaxial deposition chamber can lead to non-uniform thickness and concentration of material deposited onto the substrate.

Accordingly, the inventors have provided an improved apparatus for heating and temperature management of a substrate processing system.

SUMMARY

Methods and apparatus for an upper reflector assembly for use in a process chamber are provided herein. In some embodiments, an upper reflector assembly for use in a process chamber includes a reflector mounting ring; and upper reflector plate coupled to the reflector mounting ring and having an upper surface and lower surface, wherein the lower surface includes a plurality of linear channels extending substantially parallel to each other across the lower surface, and wherein the upper reflector plate includes air cooling slots extending from the upper surface to the lower surface.

In some embodiments, an upper lamp module includes an upper reflector assembly including a reflector mounting ring coupled to an upper reflector plate having an upper surface and lower surface, wherein the lower surface includes a plurality of linear channels extending substantially parallel to each other across the lower surface, and wherein the upper reflector plate includes air cooling slots extending from the upper surface to the lower surface; and a shroud assembly including an outer housing coupled to a lamp mounting ring and a plurality of linear heating lamps coupled to the lamp mounting ring, wherein the lamp mounting ring is removably coupled to the reflector mounting ring, and wherein the plurality of linear heating lamps extend within the plurality of linear channels to reflect heat off of sidewalls of the plurality of linear channels.

In some embodiments, an epitaxial chamber includes a chamber body coupled to an upper dome and a lower dome to define a processing volume of the epitaxial chamber; a support pedestal disposed in the interior volume to support a substrate; an upper reflector plate coupled to the chamber body above the upper dome and having an upper surface and lower surface, wherein the lower surface includes a plurality of linear channels extending substantially parallel to each other across the lower surface, and wherein the upper reflector plate includes air cooling slots extending from the upper surface to the lower surface; and a shroud assembly including a lamp mounting ring and a plurality of linear heating lamps coupled to the lamp mounting ring, wherein the plurality of linear heating lamps extend within the plurality of linear channels to reflect heat off of sidewalls of the plurality of linear channels towards the upper dome.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of an upper lamp module for use in a substrate process chamber are provided herein. The upper lamp module includes an upper reflector assembly having reflectors coupled to a shroud assembly having a plurality of linear heating lamps. The reflectors are advantageously shaped to focus energy from the plurality of linear heating lamps to specific locations on a surface of a substrate being processed for improved thermal uniformity and profile control.

Figure 1:
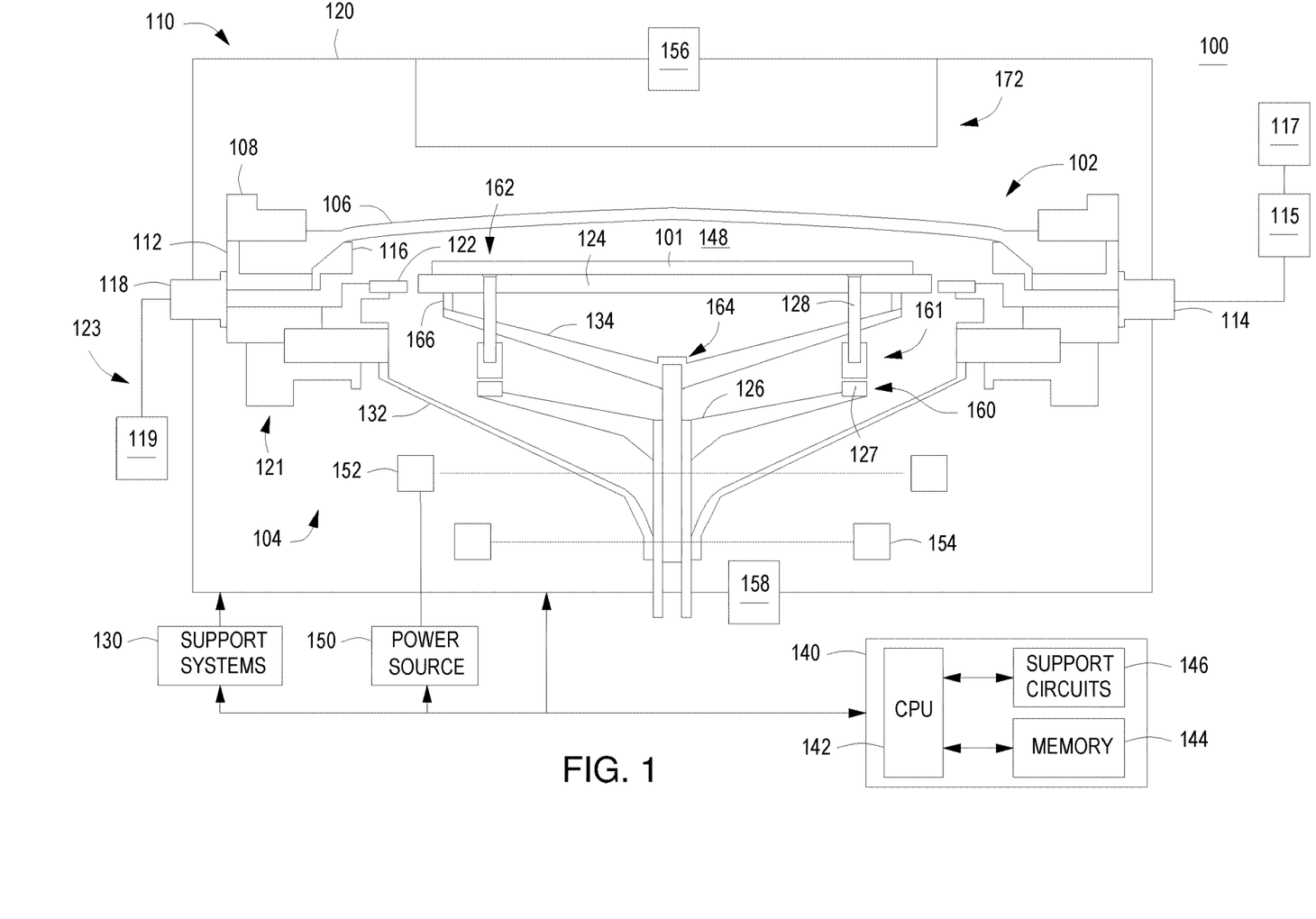
FIG. 1 depicts a schematic side view of a process chamber in accordance with some embodiments of the present disclosure.

FIG. 1 depicts a schematic side view of a process chamber 100 in accordance with some embodiments of the present disclosure. In some embodiments, the process chamber 100 may be a suitably modified commercially available process chamber, such as any epitaxial deposition reactors available from Applied Materials, Inc. of Santa Clara, Calif., for example, any of the Centura® EPI line of process chambers or any suitable semiconductor process chamber that may use heating lamps as described herein. Other process chambers that use heating lamp assemblies may also benefit from the teachings provided herein. In some embodiments, the process chamber 100 is an epitaxial deposition chamber. The process chamber 100 may generally comprise a chamber body 110, support systems 130, a controller 140, and a power source 150. The chamber body 110 generally includes an upper portion 102, a lower portion 104, and an enclosure 120. A vacuum system 123 may be coupled to the chamber body 110 to facilitate maintaining a desired pressure within the chamber body 110. In some embodiments, the vacuum system 123 may comprise a throttle valve (not shown) and vacuum pump 119 which are used to exhaust the chamber body 110. In some embodiments, the pressure inside the chamber body 110 may be regulated by adjusting the throttle valve and/or vacuum pump 119.

The upper portion 102 is disposed on the lower portion 104 and includes an upper dome 106, a clamp ring 108, a liner 116, a baseplate 112, an upper lamp module 172, and an upper pyrometer 156. The upper lamp module 172 is disposed above the upper dome 106. In some embodiments, the upper dome 106 has a dome-like form factor, however, lids having other form factors (e.g., flat or reverse curve lids) are also contemplated.

The lower portion 104 is coupled to an inlet port 114 and an exhaust port 118 and comprises a baseplate assembly 121, a lower dome 132, a substrate support 124, a pre-heat ring 122, a substrate lift assembly 160, a substrate support assembly 164, a lower heating lamp assembly 152, a lower reflector assembly 154 and a lower pyrometer 158. The upper dome 106 and the lower dome 132 are coupled to the chamber body 110 to define a processing volume 148 of the process chamber 100. The substrate support 124 is disposed in the processing volume 148 to support a substrate 101. In some embodiments, the substrate 101 may be a semiconductor wafer, such as a 150 mm, 200 mm, 300 mm, 450 mm wafer, or the like, or any other type of substrate used in thin film fabrication processes. In some embodiments, the substrate 101 may be a patterned substrate.

Although the term "ring" is used to describe certain components of the process chamber 100, such as the pre-heat ring 122, the shape of these components need not be circular and may include any shape, including but not limited to, rectangles, polygons, ovals, and the like. In some embodiments, a gas supply 117 may provide one or more process gases to the process chamber 100 via the inlet port 114. In such embodiments, a valve or mass flow controller 115 may be coupled to the gas supply 117 to control a flow of process gases from the gas supply 117. The upper dome 106, the clamp ring 108, and the lower dome 132 are formed from quartz; however, other IR-transparent and process compatible materials may also be used to form these components.

During processing, the substrate 101 is disposed on the substrate support 124. One or more heating lamp assemblies (e.g., heating lamp assembly 238 described below, lower heating lamp assembly 152) comprising a plurality of heating lamps, which are sources of infrared (IR) radiation (e.g., heat), are used to generate a pre-determined temperature distribution across the substrate 101. The one or more heating lamp assemblies receive power from the power source 150.

The substrate support assembly 164 generally includes a support bracket 134 having a plurality of support pins 166 coupled to the substrate support 124. The substrate lift assembly 160 comprises a substrate lift shaft 126 and a plurality of lift pin modules 161 selectively resting on respective pads 127 of the substrate lift shaft 126. In some embodiments, a lift pin module 161 comprises an optional upper portion of the lift pin 128 that is movably disposed through a first opening 162 in the substrate support 124. In operation, the substrate lift shaft 126 is moved to engage the lift pins 128. When engaged, the lift pins 128 may raise the substrate 101 above the substrate support 124 or lower the substrate 101 onto the substrate support 124.

The support systems 130 include components used to execute and monitor pre-determined processes (e.g., growing epitaxial films) in the process chamber 100. Such components generally include various sub-systems. (e.g., gas panel(s), gas distribution conduits, vacuum and exhaust sub-systems, and the like) and devices (e.g., power supplies, process control instruments, and the like) of the process chamber 100. These components are well known to those skilled in the art and are omitted from the drawings for clarity.

The controller 140 may be provided and coupled to the process chamber 100 for controlling the components of the process chamber 100. The controller 140 may be any suitable controller for controlling the operation of a substrate process chamber. The controller 140 generally comprises a Central Processing Unit (CPU) 142, a memory 144, and support circuits 146 and is coupled to and controls the process chamber 100, support systems 130, and the power source 150, directly (as shown in FIG. 1) or, alternatively, via computers (or controllers) associated with the process chamber and/or the support systems.

The CPU 142 may be any form of a general-purpose computer processor that can be used in an industrial setting. The support circuits 146 are coupled to the CPU 142 and may comprise cache, clock circuits, input/output subsystems, power supplies, and the like. Software routines may be stored in the memory 144 of the controller 140. The software routines, when executed by the CPU 142, transform the CPU 142 into a specific purpose computer (controller) 140. The software routines may also be stored and/or executed by a second controller (not shown) that is located remotely from the controller 140. Alternatively, or in combination, in some embodiments, for example where the process chamber 100 is part of a multi-chamber processing system, each process chamber of the multi-chamber processing system may have a respective controller for controlling portions of the inventive methods disclosed herein that may be performed in that particular process chamber. In such embodiments, the individual controllers may be configured similar to the controller 140 and may be coupled to the controller 140 to synchronize operation of the process chamber 100.

Figure 2:
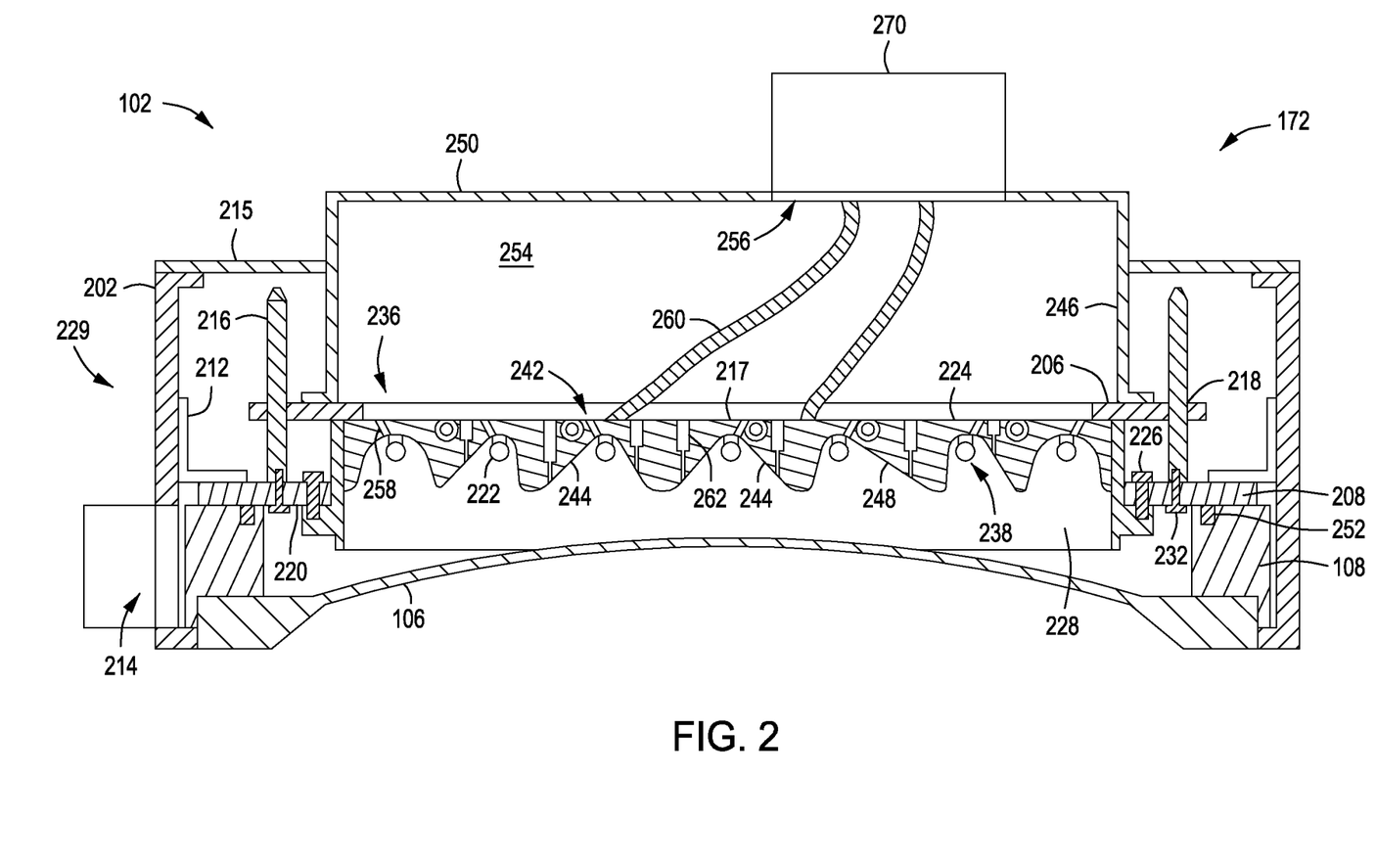
FIG. 2 depicts a partial schematic side view of a process chamber in accordance with some embodiments of the present disclosure.

FIG. 2 depicts a partial schematic side view of a process chamber 100 in accordance with some embodiments of the present disclosure. In some embodiments, the upper lamp module 172 includes a shroud assembly 229 removably coupled to an upper reflector assembly 236. In some embodiments, the shroud assembly 229 includes an outer housing 202 coupled to a lamp mounting ring 208 disposed therein. In some embodiments, the lamp mounting ring 208 is coupled to the outer housing 202 via one or more brackets 212. The outer housing 202 generally is an annular body having a central opening 204. In some embodiments, the outer housing 202 may partially define the enclosure 120. A sidewall of the outer housing 202 includes an exhaust port 214 to provide a gas outlet for any gas, such as air, that is introduced through the central opening 204.

The lamp mounting ring 208 is coupled to a heating lamp assembly 238. The heating lamp assembly 238 comprises a plurality of linear heating lamps 222 that extend across a central opening of the lamp mounting ring 208. In some embodiments, an annular heat shield 228 is coupled to the lamp mounting ring 208. In some embodiments, the annular heat shield 228 is coupled to the first protrusions 220 in any suitable manner, for example, via fastener 226. The annular heat shield 228 advantageously reflects heat from the linear heating lamps 222 towards the upper dome 106. In some embodiments, the annular heat shield 228 is gold plated.

The upper reflector assembly 236 includes a reflector mounting ring 206 disposed about and coupled to an upper surface 217 of an upper reflector plate 224. The upper reflector plate 224 is disposed above the upper dome 106. A lower surface 248 of the upper reflector plate 224 includes a plurality of linear channels 244 extending substantially parallel to each other across the lower surface 248. The plurality of linear heating lamps 222 extend within the plurality of linear channels 244 to reflect heat off of sidewalls of the plurality of linear channels 244 and direct heat towards the upper dome 106. The plurality of linear channels 244 have different cross-sectional shapes to focus peak irradiation at specific location on the wafer to enable control of temperature at those locations. In some embodiments, the plurality of linear channels 244 have at least one of a U-shaped cross section, a V-shaped cross section, an elliptical cross section, a parabolic cross section, or a rectangular cross section. The lower surface 248 of the upper reflector plate 224 can be designed to deliver irradiance peaks at many locations across the substrate 101 to advantageously enable better thermal profile control. In some embodiments, the plurality of linear channels 244 comprises up to ten linear channels. In some embodiments, the upper reflector plate is configured to generate up to as many irradiance peaks as the number of lamps in the plurality of linear heating lamps 222. In some embodiments, the upper reflector plate 224 is gold plated. In some embodiments, the upper reflector plate 224 comprises a plurality of portions that are coupled together to form a disk-shaped plate.

In some embodiments, the upper reflector assembly 236 includes an inner housing 246 coupled to a top surface of the reflector mounting ring 206. A top plate 250 having an air inlet 256 is coupled to a top of the inner housing 246 to define an interior air volume 254 therein. The air inlet 256 is coupled to an air supply duct 270 and is fluidly coupled to the exhaust port 214. In some embodiments, one or more flow turning vanes 260 are disposed between the top plate 250 and the upper reflector plate 224 to split a flow of air from the air inlet 256 and direct the flow of air to various zones of the upper reflector plate 224. In some embodiments, the one or more flow turning vanes 260 are coupled to the upper surface 217 of the upper reflector plate 224. In some embodiments, the upper reflector assembly 236 includes a flange 215 coupled to the inner housing 246 and extending radially outward to mate with the outer housing 202.

The upper reflector plate 224 includes air cooling slots 242 extending from the upper surface 217 to the lower surface 248. The upper reflector assembly 236 and the shroud assembly 229 are configured to flow air from the air inlet 256 to the exhaust port 214 via the air cooling slots 242 of the upper reflector plate 224 and the annular heat shield 228. In some embodiments, the air cooling slots 242 includes a plurality of first slots 258 configured to direct a stream of air towards the plurality of linear heating lamps 222 to cool the plurality of linear heating lamps 222 to maintain a target lamp temperature. In some embodiments, the target lamp temperature is less than 800 degrees Celsius. In some embodiments, the plurality of first slots 258 advantageously extend at an angle less than 90 degrees with respect to the upper surface 217 of the upper reflector plate 224 to control the amount of cooling air to the plurality of linear heating lamps 222 relative to the cooling air provided to the upper dome 106. In some embodiments, the air cooling slots 242 include a plurality of second slots 262 to advantageously cool the upper dome 106 to maintain a target upper dome temperature. In some embodiments, the target upper dome temperature is about 200 to about 600 degrees Celsius. In some embodiments, the plurality of first slots 258 are smaller than the plurality of second slots 262. The air cooling slots 242 are sized to give adequate backpressure for flow uniformity slot to slot. In some embodiments, the plurality of second slots 262 extend orthogonal to the upper surface 217 of the upper reflector plate 224.

In some embodiments, the lamp mounting ring 208 includes a plurality of first protrusions 220 extending radially inward from the lamp mounting ring 208. In some embodiments, a plurality of alignment pins 216 are coupled to the lamp mounting ring 208. In some embodiments, each pin of the plurality of alignment pins 216 is coupled to a corresponding one of the first protrusions 220. In some embodiments, the plurality of alignment pins 216 are coupled to the first protrusions 220 via a fastener 232. The plurality of alignment pins 216 are configured to extend through openings 218 in the reflector mounting ring 206 to align and removably couple the lamp mounting ring 208 to the reflector mounting ring 206. The lamp mounting ring 208 is removably coupled to the reflector mounting ring 206 so that the reflector mounting ring 206 can be advantageously easily removed to gain access to the linear heating lamps 222 for replacement and access to an interior of the process chamber 100 for visual inspection. In some embodiments, the lamp mounting ring 208 includes one or more pins 252 extending from a lower surface of the lamp mounting ring 208 to align the lamp mounting ring 208 to the clamp ring 108.

The plurality of linear heating lamps 222 are positioned as close as possible to the upper dome 106 to improve radiative efficiency and thermal control, but far enough away to prevent local cold spots that may lead to parasitic deposition inside the upper dome 106. In some embodiments, the plurality of linear heating lamps 222 are disposed about 25.0 to about 150.0 mm away from the upper dome 106. The proximity between the plurality of linear heating lamps 222 and the upper dome 106 advantageously allows for improved radiative efficiency so less power is required to reach processing temperatures. The close proximity also advantageously enables efficient dome cooling as gas flow through the plurality of air cooling slots 242 directly impinges on the dome improving convective heat transfer.

Figure 3:
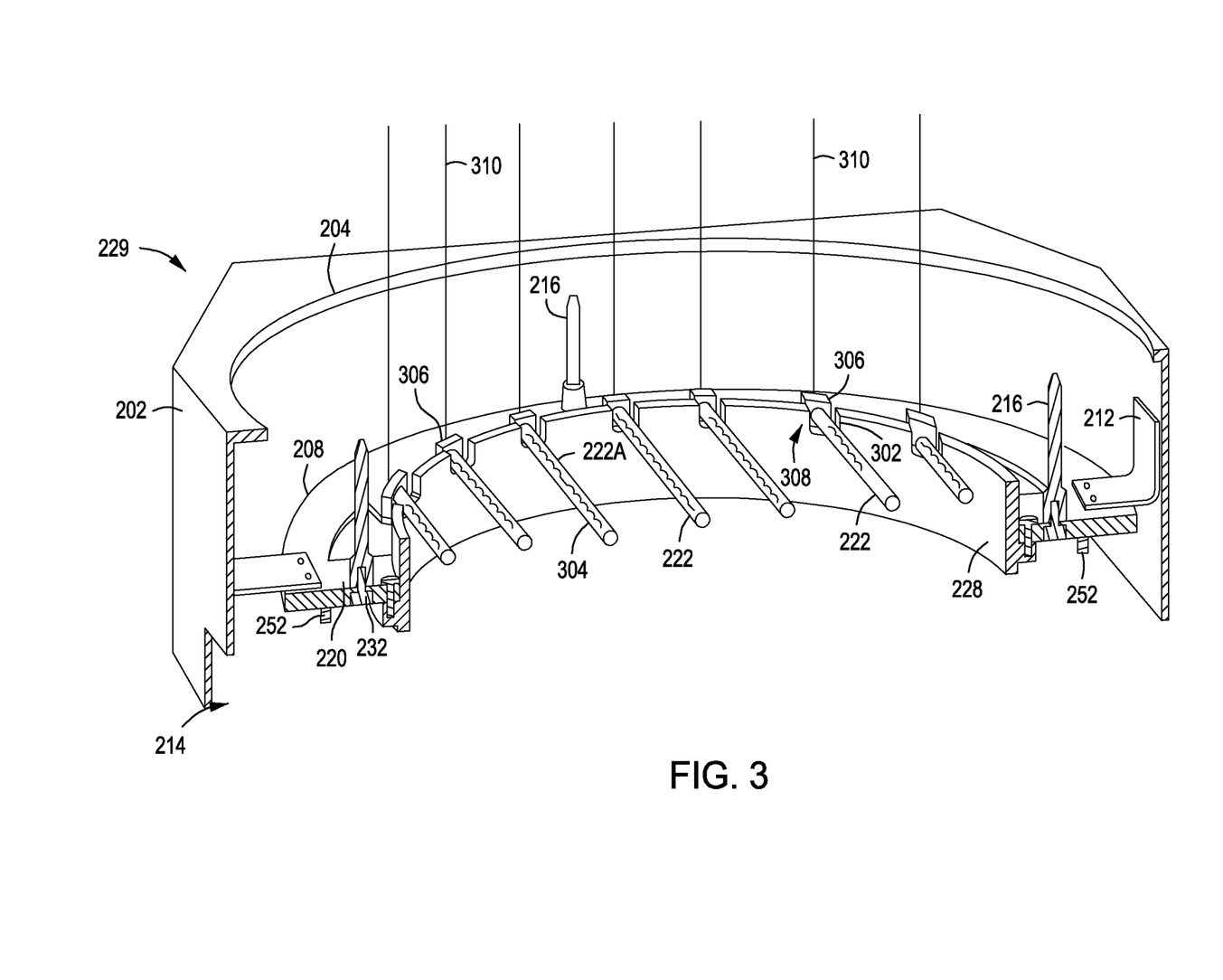
FIG. 3 depicts an isometric cross-sectional view of a process chamber in accordance with some embodiments of the present disclosure.

FIG. 3 depicts a partial isometric cross-sectional view of a process chamber in accordance with some embodiments of the present disclosure. In some embodiments, the plurality of linear heating lamps 222 extend through cutouts 302 in the annular heat shield 228. In some embodiments, the plurality of linear heating lamps 222 are tungsten halogen lamps. In some embodiments, a first end 308 of each one of the plurality of linear heating lamps 222 is coupled to the lamp mounting ring 208 via a lamp clamping mechanism 306. In some embodiments, each one of the plurality of linear heating lamps 222 is coupled to a power line 310 to provide power to the plurality of linear heating lamps 222. In some embodiments, the plurality of linear heating lamps 222 comprise up to ten lamps for processing a 300 mm semiconductor substrate. Each lamp of the plurality of linear heating lamps 222 includes a filament 304. An overall length of each lamp of the plurality of linear heating lamps 222 is larger than a lighted filament length in order to move the first end 308 having a lamp pinch point (e.g., pinched portion 404), which is a structurally weaker portion of the plurality of linear heating lamps 222, away from the hot areas of the process chamber 100.

The plurality of linear heating lamps 222 are of different sizes to maximize the length of the filaments 304 over a processing volume 148 that is circular in shape. For example, lamps of the plurality of linear heating lamps 222 that extend over a central region within the lamp mounting ring 208 are generally longer in length than lamps that extend over a peripheral region within the lamp mounting ring 208. The filament 304 can emit a continuous radiative flux along the axis of each lamp of the plurality of linear heating lamps 222 or the filament 304 can be profiled to allow varying radiative flux along the axis of each lamp of the plurality of linear heating lamps 222. For example, lamp 222A of the plurality of linear heating lamps 222 depicts a filament 304 that is profiled by having a gap between coiled portions of the filament 304 to vary radiative flux along the axis of lamp 222A. The length of the filament 304 and radiative profile of the filament 304 along the axis are chosen to tune the irradiance profile on the substrate 101.

The plurality of linear heating lamps 222 can be oriented with the axis of the lamp parallel or perpendicular to the gas flow path of the process gas (e.g., from gas supply 117). As shown in FIG. 2, the lamps are oriented perpendicular to the gas flow path. In addition to the plurality of linear heating lamps 222 being able to control the thermal profile over the substrate 101, the lamps closest to the inlet port 114 can be used to change the temperature of the pre-heat ring 122 and/or the substrate support to allow for varying amounts of gas preheating. The additional control over the temperature of the pre-heat ring 122 and/or the substrate support advantageously provides an additional tuning nob for thickness and/or concentration uniformity over the substrate 101. When the plurality of linear heating lamps 222 are oriented parallel to the flow path, temperatures of the liner 116 and the pre-heat ring 122 at the leading and trailing edges of the gas flow path can be lower. A lower temperature of the liner 116 and the pre-heat ring 122 at the leading and trailing edges of the gas flow path can advantageously decrease parasitic deposition on the liner 116 and the pre-heat ring 122, can advantageously increase deposition rate, and can advantageously reduce the time to perform an in-situ clean of the process chamber 100.

Figure 4:
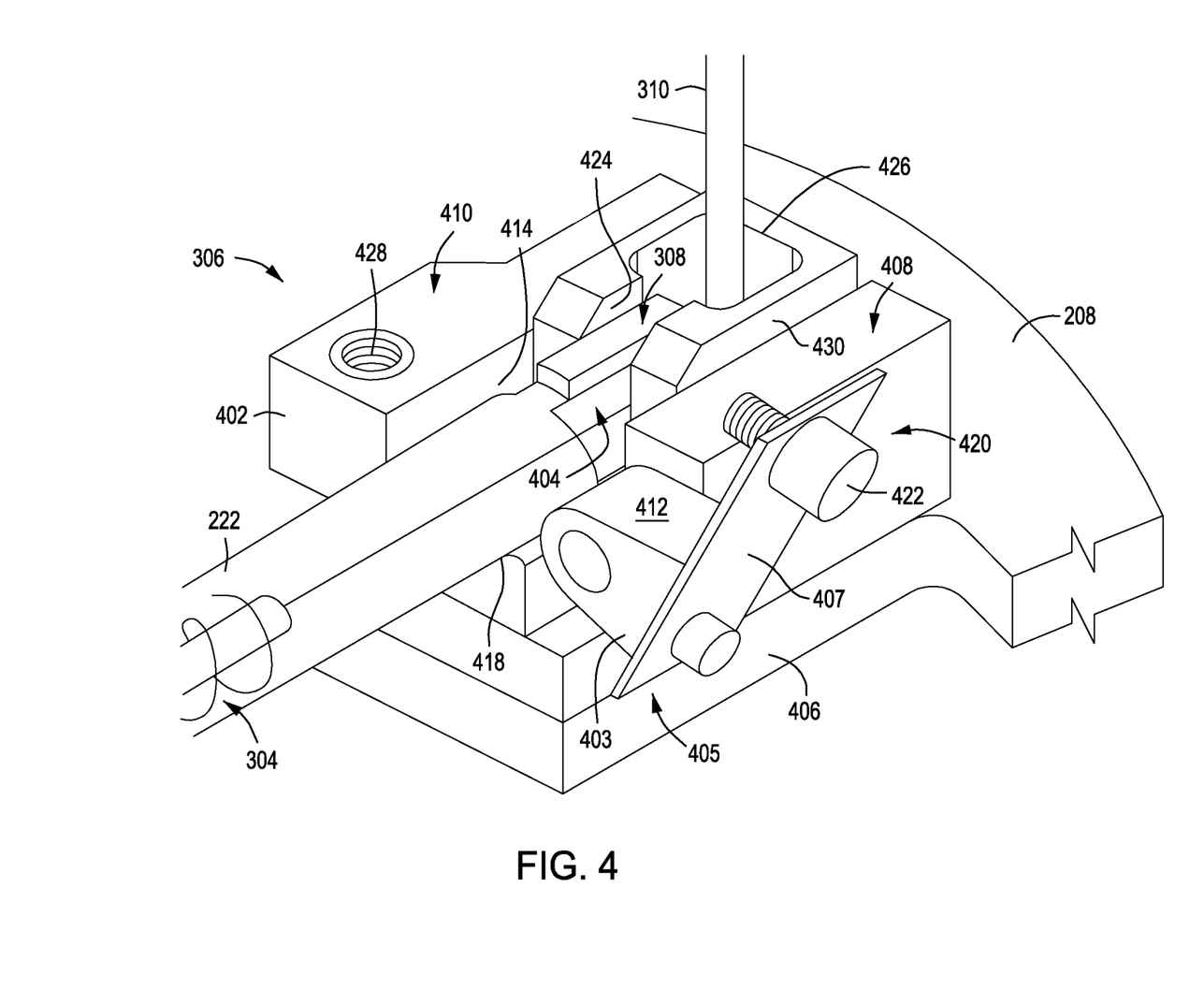
FIG. 4 depicts an isometric view of a lamp clamping mechanism in accordance with some embodiments of the present disclosure.

FIG. 4 depicts an isometric view of a lamp clamping mechanism 306 in accordance with some embodiments of the present disclosure. In some embodiments, the lamp mounting ring 208 includes a second plurality of protrusions 406 extending radially inward from the lamp mounting ring 208. In some embodiments, the lamp clamping mechanism 306 includes a mounting block 402 coupled to the lamp mounting ring 208. In some embodiments, the lamp clamping mechanism 306 is coupled to each one of the second plurality of protrusions 406. The mounting block 402 includes a first side 408 and second side 410 and a slot 414 disposed between the first side 408 and the second side 410. The slot 414 is configured to accommodate a lamp of the plurality of linear heating lamps 222. In some embodiments, an upper surface 418 of the mounting block 402 along the slot 414 is contoured to position each lamp of the plurality of linear heating lamps 222. The first end 308 of the plurality of linear heating lamps 222 include a pinched portion 404, where the plurality of linear heating lamps 222 have a rectangular cross-sectional profile as opposed to a circular cross-sectional profile of a remainder of the plurality of linear heating lamps 222.

In some embodiments, the lamp clamping mechanism 306 includes a rear block 430 coupled to the mounting block 402 and disposed in the slot 414. In some embodiments, the rear block 430 has an opening 426 to accommodate the power line 310. In some embodiments, the rear block 430 includes a slot 424 that extends from the opening 426 to an outer surface of the rear block 430. In some embodiments, the pinched portion 404 is disposed in the slot 424 to prevent rotational movement of each of the plurality of linear heating lamps 222 with respect to the mounting block 402.

The mounting block 402 includes a clamp 412 rotatably coupled to the first side 408 of the mounting block 402. In some embodiments, the clamp 412 includes a body 403 coupled to a first end 405 of an arm 407. A second end 420 of the arm 407 includes a pin 422. In use, the second end 420 of the arm 407 swings over each lamp of the plurality of linear heating lamps 222 to the second side 410 so that the pin 422 can enter an opening 428 in the second side 410 to retain each lamp between the arm 407 and the upper surface 418. In some embodiments, the pin 422 is threaded to engage corresponding threads disposed in the opening 428.

Figure 5:
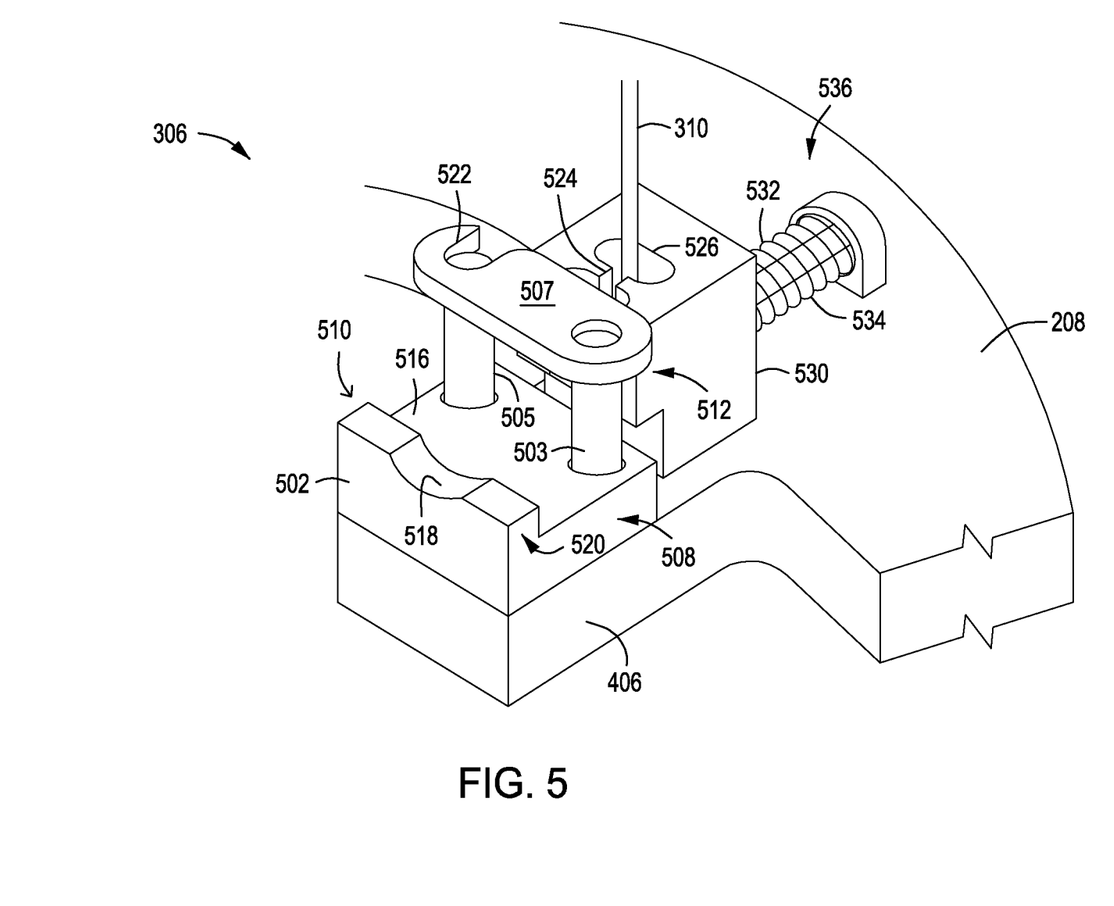
FIG. 5 depicts an isometric view of a lamp clamping mechanism in accordance with some embodiments of the present disclosure.

FIG. 5 depicts an isometric view of a lamp clamping mechanism 306 in accordance with some embodiments of the present disclosure. A lamp of the plurality of linear heating lamps 222 is omitted from FIG. 5 so that details of the lamp clamping mechanism 306 are not obscured. In some embodiments, the lamp clamping mechanism 306 includes a mounting block 502 coupled to the lamp mounting ring 208. In some embodiments, the mounting block 502 is coupled to each one of the second plurality of protrusions 406. In some embodiments, the mounting block 502 includes a body 516 and a raised portion 520. The raised portion includes an upper surface 518 that is contoured to position each lamp of the plurality of linear heating lamps 222.

The mounting block 502 includes a first side 508 and second side 510. In some embodiments, a clamp 512 is rotatably coupled to the body 516 of the mounting block 502. In some embodiments, the clamp 512 includes a first pin 503 rotatably coupled to the mounting block 502 and an arm 507 coupled to the first pin 503. In some embodiments, a second pin 505 is coupled to the mounting block 502. The arm 507 includes a groove 522 that is configured to accommodate the second pin 505 when the arm 507 is rotated towards the second pin 505. The second pin 505 is configured to prevent further rotation of the arm 507. In some embodiments, the first pin 503 is disposed proximate the first side 508 and the second pin 505 is disposed proximate the second side 510. In some embodiments, the first pin 503 is disposed proximate the second side 510 and the second pin 505 is disposed proximate the first side 508. A lamp of the plurality of linear heating lamps 222 is retained between the first pin 503 and the second pin 505 and the arm 507 and the body 516.

In some embodiments, the lamp clamping mechanism 306 includes a rear block 530 disposed on the lamp mounting ring 208. In some embodiments, the lamp clamping mechanism 306 includes a pin 532 that extends through the rear block 530 and is coupled to the mounting block 502 such that the rear block 530 can move laterally along the pin 532. A biasing element 534 is disposed about the pin 532 between a head 536 of the pin 532 and the rear block 530 to urge the rear block 530 and each lamp of the plurality of linear heating lamps 222 towards the mounting block 502. The biasing element 534 urges an end opposite the first end 308 of each lamp of the plurality of linear heating lamps 222 towards a fixed position block (not shown) to provide repeatable axial alignment of each lamp with respect to the mounting block 502. The rear block 530 may be urged toward the head 536 to facilitate installation and removal of each of the plurality of linear heating lamps 222. In some embodiments, the rear block 530 has an opening 526 to accommodate the power line 310. In some embodiments, the rear block 530 includes a slot 524 that extends from the opening 526 to an outer surface of the rear block 530. In some embodiments, the pinched portion 404 is disposed in the slot 524 to prevent rotational movement of each of the plurality of linear heating lamps 222 with respect to the mounting block 502.

Figure 6:
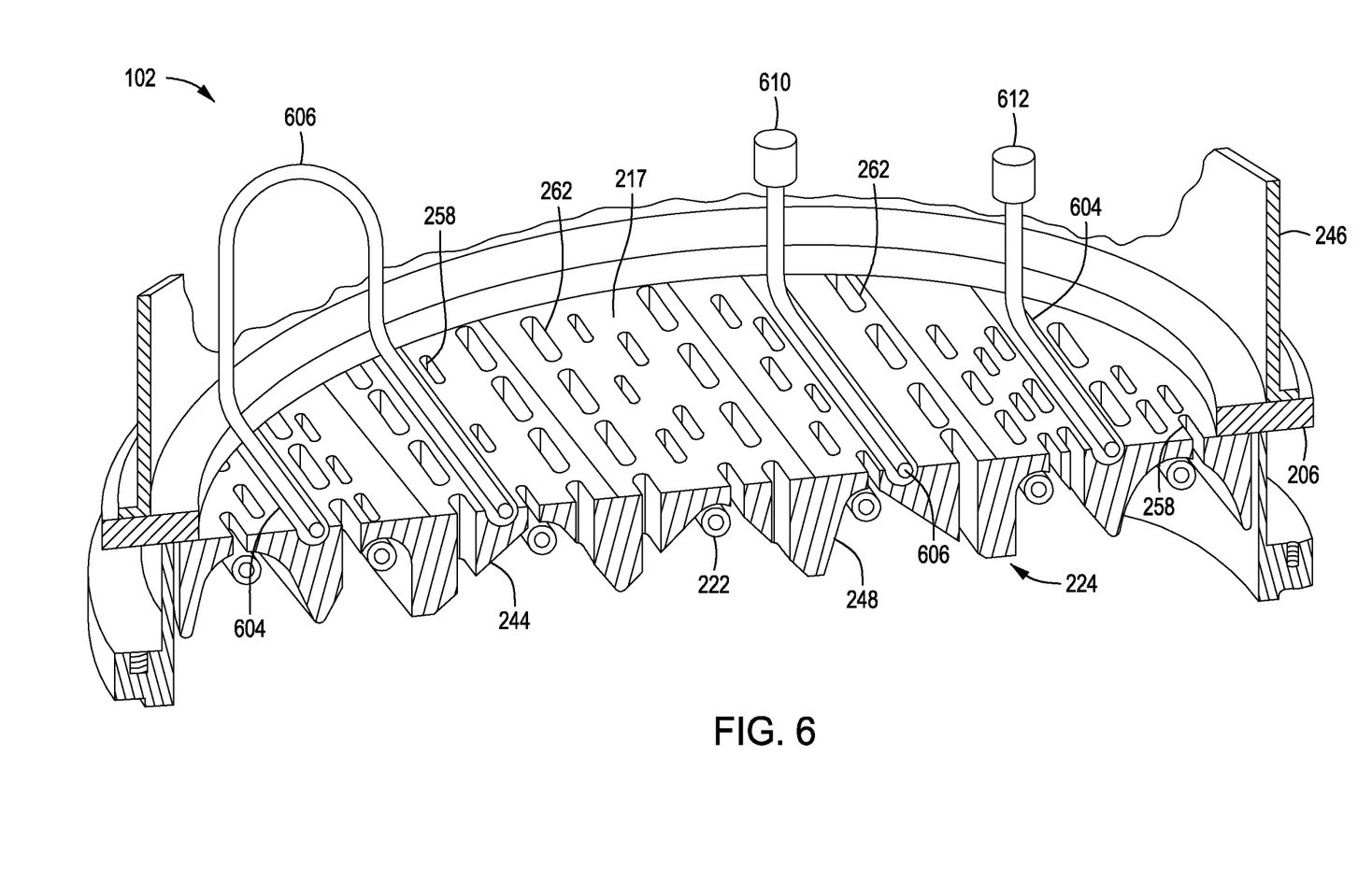
FIG. 6 depicts a partial isometric cross-sectional view of an upper lamp module in accordance with some embodiments of the present disclosure.

FIG. 6 depicts a partial isometric cross-sectional view of an upper lamp module in accordance with some embodiments of the present disclosure. In some embodiments, the upper reflector plate 224 is cooled to reduce or prevent gold plating failure. In some embodiments, the upper surface 217 of the upper reflector plate 224 includes a plurality of coolant channels 604. In some embodiments, the plurality of coolant channels 604 extend parallel to the plurality of linear heating lamps 222. A cooling tube 606 is disposed in the plurality of coolant channels to circulate a coolant therethrough. The cooling tube 606 is coupled to an inlet 610 at one end to an outlet 612 at another end. In some embodiments, the number of the plurality of coolant channels 604 corresponds with the number of the plurality of linear channels 244.

Figure 7:
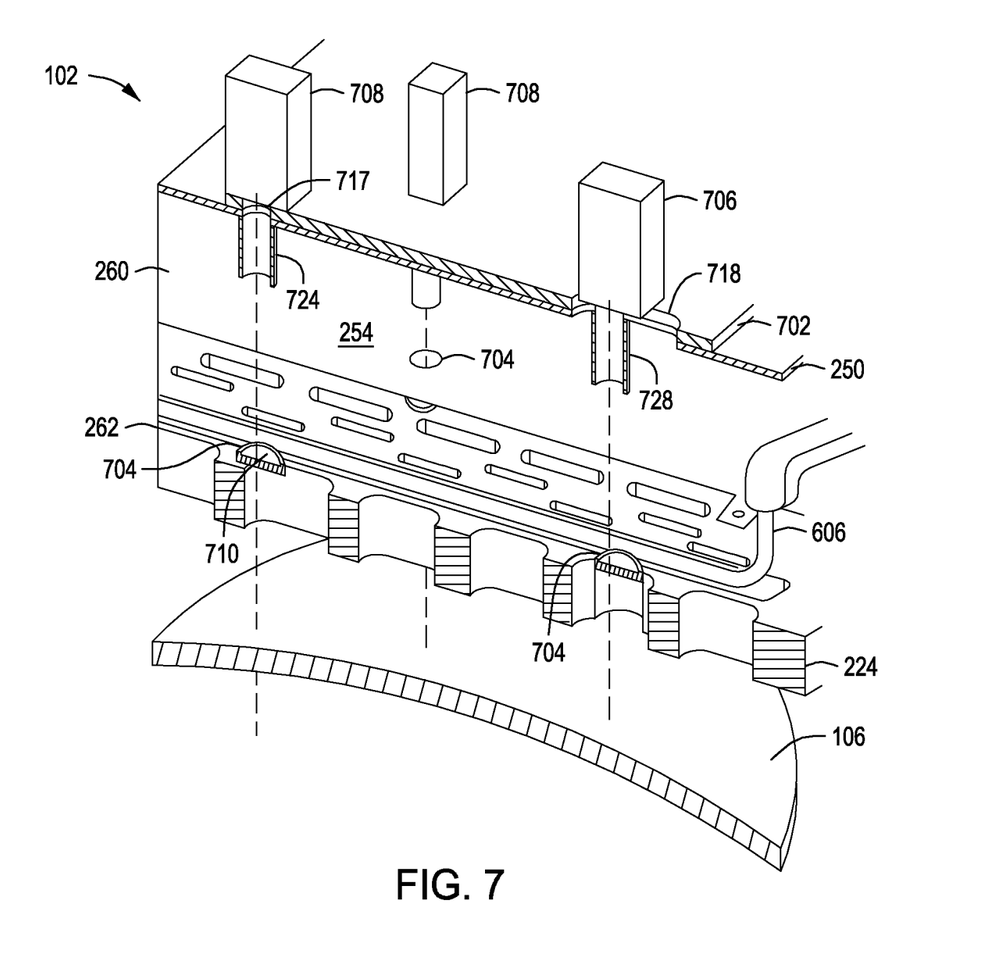
FIG. 7 depicts a partial isometric cross-sectional view of an upper lamp module in accordance with some embodiments of the present disclosure.

FIG. 7 depicts a partial isometric cross-sectional view of an upper lamp module in accordance with some embodiments of the present disclosure. In some embodiments, a mounting block 702 is disposed on the top plate 250. In some embodiments, one or more temperature sensors 708, for measuring a temperature for at least one of the upper dome 106 and the substrate 101, are mounted to the mounting block 702. The mounting block 702 and the top plate 250 include openings 717 to provide an optical path from the one or more temperature sensors 708 to the upper dome 106. In some embodiments, the one or more temperature sensors 708 are pyrometers. In some embodiments, a shield tube 724 extends from the one or more temperature sensors 708 and into the interior air volume 254 to shield the one or more temperature sensors 708 from thermal noise.

In some embodiments, one or more lasers 706 are mounted to the mounting block 702 to transmit photon energy to the substrate 101 to provide local spot heating during processing. Local spot heating can increase deposition rates on a targeted area of the substrate 101. The mounting block 702 and the top plate 250 include openings 718 to provide a path for the one or more lasers 706 towards the upper dome 106. In some embodiments, a shield tube 728 extends from the one or more lasers 706 and into the interior air volume 254. In some embodiments, the one or more lasers 706 includes alignment features to adjust a laser head to accurately position the laser head. In some embodiments, the one or more lasers 706 are positioned between 0.0 mm and 160.0 mm from a center of the upper dome 106. In some embodiments, where the upper portion 102 includes one or more flow turning vanes 260, openings 704 are provided in the one or more flow turning vanes 260 to provide for a laser path for the one or more lasers 706 and an optical path for the one or more temperature sensors 708 therethrough.

In some embodiments, the upper reflector plate 224 includes openings 704 for a laser path for the one or more lasers 706 and an optical path for the one or more temperature sensors 708. In some embodiments, a transparent window 710 is placed over the openings 704 to reduce or prevent local cold spots on the upper dome 106 from cooling air passing through the openings 704. The transparent window 710 is made of a material suitable of transmitting a signal from at least one of the substrate 101 or the upper dome 106 to the one or more temperature sensors 708. In some embodiments, the transparent window 710 is configured to transmit a signal having a wavelength of about 2.5 micrometers to about 5.0 micrometers. In some embodiments, the transparent window 710 is coated with a suitable material for transmitting a signal having a wavelength of about 2.5 micrometers to about 5.0 micrometers. In some embodiments, the coating on the transparent window 710 is an anti-reflective coating. In some embodiments, the transparent windows 710 are made of quartz or calcium fluoride ($CaF_2$). In some embodiments, the transparent windows 710 are made of clear quartz for substrate 101 temperature measurements. Quartz may be used to minimize signal loss from the substrate 101 to the one or more temperature sensors 708. In some embodiments, the transparent windows 710 are made of $CaF_2$ for upper dome 106 measurements. $CaF_2$ may be used to minimize signal loss from the upper dome 106 to the one or more temperature sensors 708.

In some embodiments, the one or more temperature sensors 708 may be used to calibrate an amount of power delivered to each lamp of the plurality of linear heating lamps 222 to achieve a specific temperature of the substrate 101 for a given temperature set point. In some embodiments, the one or more temperature sensors 708 are positioned across the upper reflector plate 224. The calibration can be done, for example, periodically or during any lamp replacement.

While the foregoing is directed to embodiments of the present disclosure, other and further embodiments of the disclosure may be devised without departing from the basic scope thereof.

The invention claimed is:

1. An upper reflector assembly for use in a process chamber, comprising:
    an upper reflector plate comprising:
        an upper surface;
        a lower surface;
        a plurality of linear channels extending substantially parallel to each other across the lower surface; and
        air cooling slots extending from the upper surface to the lower surface, the plurality of air cooling slots comprising a plurality of first slots and a plurality of second slots, the plurality of first slots having a smaller depth than the plurality of second slots, wherein the plurality of first slots extend at an angle less than 90 degrees with respect to the upper surface of the upper reflector plate.

2. The upper reflector assembly of claim 1, wherein the plurality of second slots extend orthogonal to the upper surface.

3. The upper reflector assembly of claim 1, wherein the upper surface includes a plurality of coolant channels.

4. The upper reflector assembly of claim 1, wherein the plurality of linear channels have different cross-sectional shapes.

5. The upper reflector assembly of claim 1, wherein the plurality of linear channels have at least one of a U-shaped cross section, a V-shaped cross section, an elliptical cross section, a parabolic cross section, or a rectangular cross section.

6. The upper reflector assembly of claim 1, further comprising a reflector mounting ring coupled to the upper reflector plate and an inner housing coupled to the reflector mounting ring and a top plate coupled to the inner housing, wherein the top plate includes an air inlet configured to facilitate a flow of air through the inner housing and through the air cooling slots.

7. The upper reflector assembly of claim 6, further comprising one or more flow turning vanes disposed between the top plate and the upper reflector plate to direct the flow of air from the air inlet to various zones of the upper reflector plate.

8. An upper reflector plate for use in a process chamber, comprising:
   an upper surface;
   a lower surface;
   a plurality of linear channels extending substantially parallel to each other across the lower surface, wherein each of the plurality of linear channels have one of a U-shaped cross section, a V-shaped cross section, an elliptical cross section, a parabolic cross section, or a rectangular cross section, wherein one or more of the plurality of linear channels have different cross sectional shapes from the remaining linear channels of the plurality of channels;
   a plurality of air cooling slots extending from the upper surface to the lower surface; and
   a plurality of coolant channels formed in the upper surface.

9. The upper reflector plate of claim 8, wherein the air cooling slots include a plurality of first slots and a plurality of second slots, wherein the plurality of first slots have a smaller depth than the plurality of second slots.

10. The upper reflector plate of claim 9, wherein the plurality of first slots extend at an angle of less than 90 degrees with respect to the upper surface.

11. The upper reflector plate of claim 8, wherein the upper reflector plate includes an opening extending from the upper surface to the lower surface and covered with a transparent window.

12. The upper reflector plate of claim 8, further comprising a gold plating disposed thereon.

13. An upper reflector assembly for use in a process chamber, comprising:
   an upper reflector plate comprising:
     an upper surface;
     a lower surface;
     a plurality of linear channels extending substantially parallel to each other across the lower surface; and
     air cooling slots extending from the upper surface to the lower surface, the plurality of air cooling slots comprising a plurality of first slots and a plurality of second slots, the plurality of first slots having a smaller depth than the plurality of second slots, wherein one or more of the plurality of linear channels have different cross sectional shapes from the remaining linear channels of the plurality of channels.

14. An upper reflector plate for use in a process chamber, comprising:
   an upper surface;
   a lower surface;
   a plurality of linear channels extending substantially parallel to each other across the lower surface, wherein each of the plurality of linear channels have one of a U-shaped cross section, a V-shaped cross section, an elliptical cross section, a parabolic cross section, or a rectangular cross section;
   a plurality of air cooling slots extending from the upper surface to the lower surface, wherein the air cooling slots include a plurality of first slots and a plurality of second slots, wherein the plurality of first slots have a smaller depth than the plurality of second slots, wherein the plurality of first slots extend at an angle of less than 90 degrees with respect to the upper surface; and
   a plurality of coolant channels formed in the upper surface.

* * * * *